United States Patent
Takahashi

(10) Patent No.: US 7,477,090 B2
(45) Date of Patent: Jan. 13, 2009

(54) CIRCUIT CHARACTERISTICS CONTROLLER

(75) Inventor: Akira Takahashi, Tokorozawa (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/423,532

(22) Filed: Jun. 12, 2006

(65) Prior Publication Data

US 2007/0229144 A1    Oct. 4, 2007

(51) Int. Cl.
*H01L 35/00* (2006.01)
*H01L 37/00* (2006.01)

(52) U.S. Cl. .................. 327/512; 327/513; 327/157; 327/108; 327/535

(58) Field of Classification Search ............ 327/333, 327/512, 262, 264, 52, 108–112, 157, 513, 327/535, 540, 541, 543; 365/211
See application file for complete search history.

(56) References Cited

U.S. PATENT DOCUMENTS

| 6,262,616 B1 * | 7/2001 | Srinivasan et al. ......... 327/264 |
| 6,316,964 B1 * | 11/2001 | Watarai ...................... 326/115 |
| 6,445,238 B1 * | 9/2002 | Lesea ......................... 327/262 |
| 7,132,880 B2 * | 11/2006 | Ingino, Jr. .................. 327/541 |

* cited by examiner

*Primary Examiner*—Quan Tra
*Assistant Examiner*—Colleen O'Toole
(74) *Attorney, Agent, or Firm*—William B. Kempler; W. James Brady, III; Frederick J. Telecky, Jr.

(57) ABSTRACT

A circuit characteristics controller (10) changes the supply voltage to circuit (12) on the basis of the characteristics of at least one transistor in circuit (12) so as to control the characteristics of circuit (12). The power source for compensation includes a threshold sensor that detects the threshold of the transistor in circuit (12) and a temperature sensor for detecting the temperature of the transistor in circuit (12). These sensors, for example, can be composed of transistors.

5 Claims, 10 Drawing Sheets

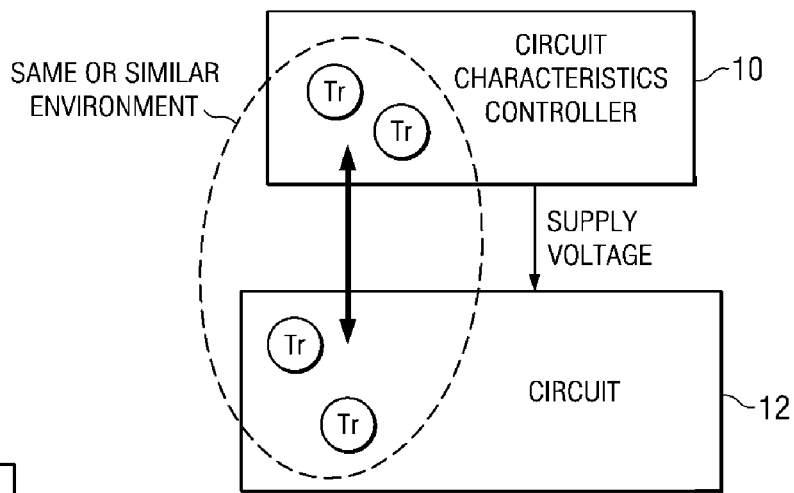
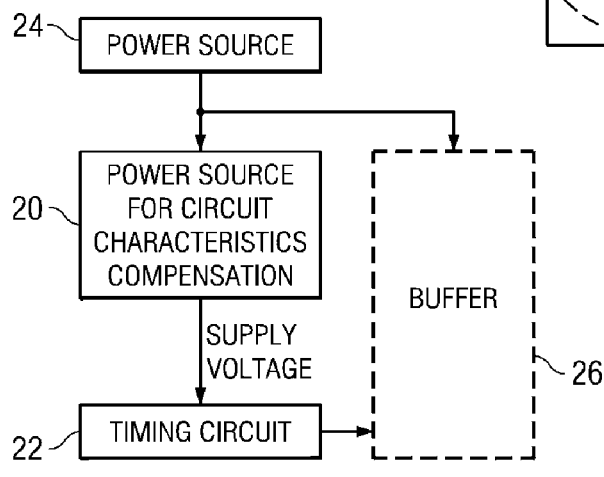
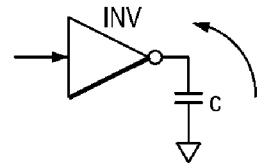
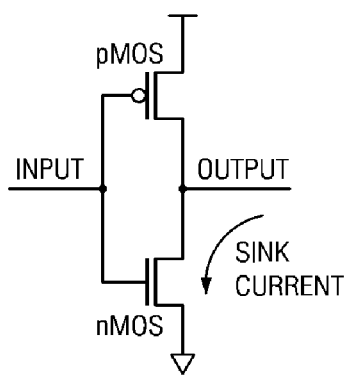
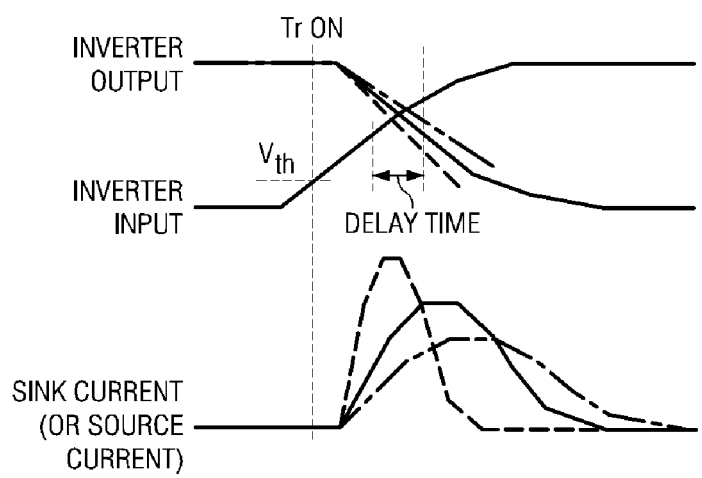

CIRCUIT CHARACTERISTICS CONTROLLER

FIELD OF THE INVENTION

The present invention pertains to a device that controls the characteristics of circuit. More specifically, the present invention pertains to a device that controls the characteristics of the circuit via the power source voltage.

BACKGROUND OF THE INVENTION

For example, a conventional LVDS (LVDS: Low Voltage Differential Signaling) transmitter is composed of two current sources, an op amp (OPAMP), P-channel (PCH) switch/ N-channel (NCH) switch for controlling the flow direction of the drive current, and a timing controller for controlling said switches. The current sources provide drive currents, and the op amp controls the common mode voltage of the transmitter output. Said PCH/NCH switches control the flow direction of the drive current. When the drive current is switched, the timing controller changes the switching timing for each switching cycle in order to prevent large changes in the drive current. The rise time and fall time are determined to a certain extent by the interval in which the timing is changed. However, because the conventional timing controller made up of a conventional inverter chain (having plural inverters connected in series), variations in the power source, the manufacturing process and temperature lead to an increase in the variation of the switching timing of the timing control signal. As a result, variations in the rise time and fall time in the transmitter output increase.

In the prior art, in order to realize a lower power consumption corresponding to the inherent characteristics of an LSI, and for other purposes, there is a technology that adopts an autonomous function of the LSI chip, see "Non-Patent Reference 1 Autonomous LSI, seeking homogeneity," Nikkei Electronics, Mar. 29, 2004, pp. 109-129.

More specifically, in the power control technology for reducing power consumption used in a portable information terminal controller, in order to realize lower power consumption, a "delay synthesizer circuit" is used (see p. 123, FIG. 3). This delay synthesizer circuit approximately reproduces the delay time of the critical bus. The virtually reproduced delay time is compared with a target value. If the delay time is less than the target value, the power source voltage supplied to the LSI chip is further reduced. As a result, the lowest necessary power source voltage is supplied to LSI.

In the power control technology for lower power consumption using said delay synthesizer circuit, it is necessary to use circuits for delay time generation, measurement and comparison, so that the circuit scale required for realizing lower power consumption is increased.

A general object of the present invention is to provide a circuit characteristics controller that can control the characteristics of the circuit on the basis of the characteristics of the transistors without using a large scale circuit. Another object of the present invention is to provide a circuit device using said circuit characteristics controller.

SUMMARY OF THE INVENTION

These and other objects and features are provided in accordance with one aspect of the invention, by a circuit characteristics controller of the present invention, in order to control the characteristics of the circuit, the voltage supplied to said circuit is changed on the basis of the characteristics of at least one transistor in said circuit.

Another aspect of the invention comprises a signal generator that generates plural control signals having a prescribed phase difference, and a voltage generator, which comprises circuit elements whose characteristics have the same variations with respect to the manufacturing process, temperature, etc. as the circuit elements of said signal generator, and which supplies the power source voltage to said signal generator.

A further aspect of the present invention, circuit comprises a signal generator that generates plural control signals having a prescribed phase difference, a voltage generator, which comprises circuit elements whose characteristics have the same variations with respect to the manufacturing process, temperature, etc. as the circuit elements of said signal generator, and which supplies the power source voltage to said signal generator, and an output circuit that is connected to the signal output terminal, and comprises plural output transistors, to the respective control terminals of which said control signals having a prescribed phase differences are applied.

BRIEF DESCRIPTION OF THE DRAWINGS

FIG. 1 is a block diagram illustrating an embodiment of the circuit characteristics controller of the present invention;

FIG. 2 is a block diagram illustrating the power source for compensating the circuit characteristics in an embodiment of the present invention;

FIG. 3 is a circuit diagram illustrating the inverter delay model and the inverter circuit and the timing diagram showing the input/output of the inverter and the sink current in the inverter for explaining the operation of the power source for compensating the circuit characteristics shown in FIG. 2;

REFERENCE NUMERALS AND SYMBOLS AS SHOWN IN THE DRAWINGS

Figure 4:
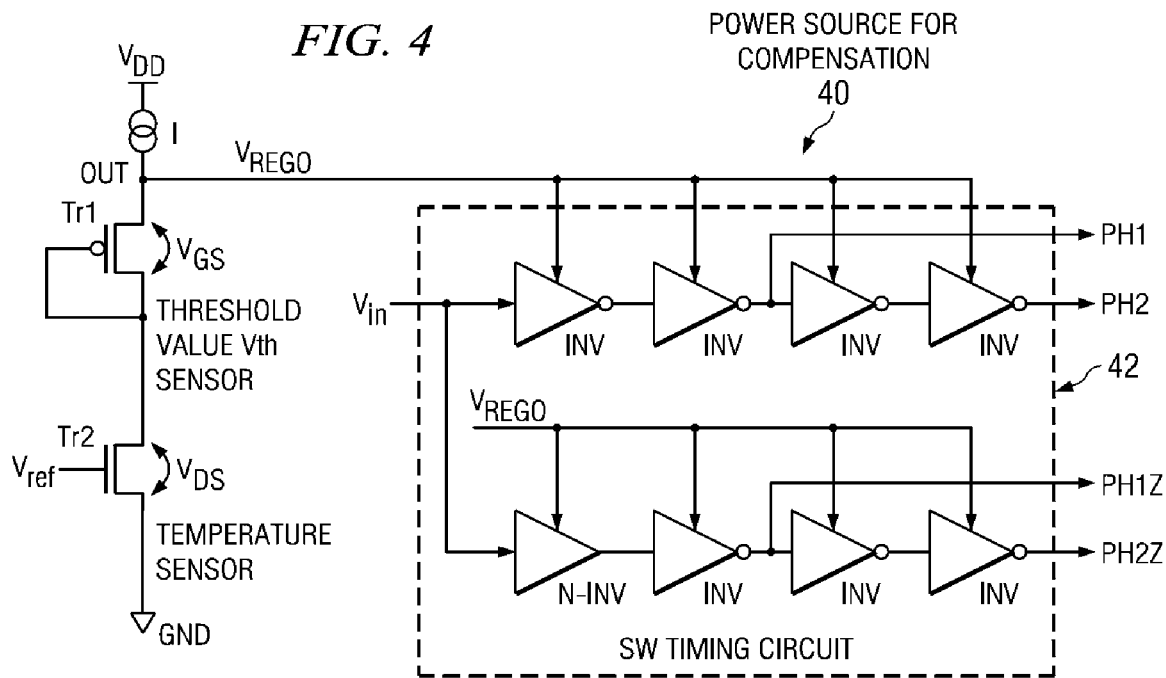
FIG. 4 is a circuit diagram illustrating the power source for compensation and the SW timing circuit as an embodiment of the power source for compensating the circuit characteristics and the timing circuit shown in FIG. 2.

10 Circuit characteristics controller
12 Circuit
20 Power source for circuit characteristics compensation
22 Timing circuit
24 Power source
26 Buffer

DESCRIPTION OF THE EMBODIMENTS

The circuit characteristics controller of the present invention can control the characteristics of the circuit on the basis of the transistors characteristics that are affected by the manufacturing process, temperature, and other environmental factors.

In the following, various embodiments of the present invention will be explained with reference to the attached figures.

First, FIG. 1 is a diagram illustrating an embodiment of the circuit characteristics correcting device of the present invention. As shown in the figure, circuit characteristics controller (10) of the present invention comprises at least one transistor for controlling the characteristics of circuit (12) or the object to be controlled. Said at least one transistor is in the same or similar environment as at least one transistor (Tr) contained in circuit (12). Circuit (12) is any circuit whose input/output response characteristics vary depending on the manufacturing process, temperature and other environmental factors. Here environmental factors are defined to include the manufacturing process of the circuit, the temperature of the circuit, and other conditions, etc. that affect the characteristics of the circuit. In addition, said at least one transistor contained in said circuit characteristics controller (10) may be in an environment identical or similar to that of all of the transistors contained in circuit (12).

In this constitution, circuit characteristics controller (10) changes the supply voltage to circuit (12) on the basis of the characteristics of at least one transistor in circuit characteristics controller (10) and the characteristics of the corresponding at least one transistor in circuit (12) in an environment identical or similar to that of said transistor. For example, when the threshold voltage of the transistor varies due to variations in the manufacturing process, the variation in the threshold voltage of said transistor will act to change the input/output response time (such as the rise time or fall time) of circuit (12) that contains the transistor. In this case, since the supply voltage changes, the response intensity of circuit (12), such as the magnitude of the sink current, source current or other drive current in the circuit, changes. The change variation in the drive current acts to compensate for the variation in the input/output response time. Even in the case when, in addition to the manufacturing process, the temperature of the circuit varies, the threshold voltage of the transistor and the magnitude of the resistance related to the transistor will vary, but such variations can be compensated for in the same way by the changes in the drive current due to the change in the supply voltage. The resistance related to the transistor includes the temperature-dependent resistance components between the electrodes or terminals of the transistor, such as the resistance of the current path between the drain and the source. In this way, circuit characteristics controller (10) in the present invention can control the characteristics of circuit (12).

In the following, an explanation will be given regarding power source (20) for compensating the circuit characteristics in an embodiment of the present invention with reference to FIG. 2. In this embodiment, power source (20) for compensating the circuit characteristics is an embodiment example of circuit characteristics controller (10) shown in FIG. 1, and timing circuit (22) is an embodiment example of circuit (12) in FIG. 1. More specifically, power source (20) for compensating the circuit characteristics receives a power source voltage from another power source (24), and the supply voltage is supplied to timing circuit (22) as the object of compensation for the circuit characteristics. Said timing circuit (22) generates or supplies at least one timing signal for operating buffer (26) or for controlling said operation. Also, buffer (26) operates when it receives the power source voltage from power source (24). Said power source (20) for compensating the circuit characteristics changes the supply voltage supplied to timing circuit (22) on the basis of the characteristics of at least one transistor in power source (20) for compensating the circuit characteristics, that is, on the basis of the characteristics of at least one transistor in timing circuit (22) in an environment identical or similar to that of the transistor.

In the embodiment shown in FIG. 2, the rise time and fall time of the timing signal supplied to buffer (26) by timing circuit (22) varies due to the manufacturing process and temperature. However, such variations can be compensated for in the same way as in FIG. 1 by changing the magnitude of the supply voltage supplied from power source (20) for compensating the circuit characteristics.

In the following, with reference to FIG. 3, a detailed explanation will be given regarding the operation of the embodiment shown in FIG. 2. As shown in FIG. 3, as an example of timing circuit (22) shown in FIG. 2, the delay model composed of an inverter and capacitor C as the load is used. This delay model is shown in FIG. 3(a), and the details of the inverter circuit are shown in FIG. 3(b). It is composed of a PMOS transistor, that is, a transistor having p-type conductivity, and an NMOS transistor, that is, a transistor having n-type conductivity. Also, in FIG. 3(c), a timing diagram of the inverter input voltage, inverter output voltage and sink current is shown. As shown in the figure, when the inverter input voltage varies and exceeds threshold voltage Vth of the NMOS transistor, the NMOS transistor is turned on, and sink current starts flowing. At the same time, the inverter output voltage begins to fall. The delay time between the inverter input voltage and the output voltage is the time delay between the 50% points. Also, the inverter output voltage indicated by the solid line corresponds to the sink current indicated by the solid line. As the supply voltage to the inverter is increased, the sink current flowing in the NMOS transistor and acting as a drive current and indicated by the broken line exhibits a steeper slope and a larger peak value than that indicated by the solid line. As a result, the inverter output falls more steeply than that indicated by the broken line, so that the delay time is reduced. Also, the dot-dash line indicates the sink current that has a gentler slope and a smaller peak value when the supply voltage is decreased, as opposed to the aforementioned case. As a result, as indicated by the dot-dash line, the inverter output falls less quickly, increasing the delay time. As a result, for example, when threshold voltage Vth increases due to processing variations, the turn-on time point of the NMOS transistor is delayed. Consequently, the delay time between the input voltage and the output voltage is increased. However, as the supply voltage to the inverter is increased, the sink current flowing in the NMOS transistor becomes steeper and has a larger peak value, so that the inverter output falls reduced. As a result, the delay time is drops. Also, when the threshold voltage becomes lower, the function is opposite to that which was described above.

In the following, an explanation will be given regarding the case when the resistance component between electrodes of the transistor, such as resistance $R_{DS}$ between the drain and source varies. For example, when RDS becomes larger due to variations in temperature, the sink current decreases. As a result, the delay time between the input voltage and the output voltage of the inverter becomes larger. Here, too, as the supply voltage to the inverter is increased, as indicated by the broken line, the sink current flowing through the NMOS transistor and acting as the drive current displays a steeper slope and a larger peak value than that indicated by the solid line. As a result, it acts to reduce the delay time. As explained above, when the inverter input falls (so that the inverter output rises), the same process occurs for the source current flowing through the PMOS transistor, and the same compensation operation can be realized.

Consequently, in the constitution as an embodiment of the present invention shown in FIG. 2, it is possible to compensate the variation in the delay time of at least one timing signal generated by the timing circuit. As a result, the timing signal can exhibit a nearly constant delay time irrespective of the variations due to the manufacturing process and temperature.

In the following, with reference to FIG. 4, an explanation will be given regarding a circuit as an embodiment of the constitution shown in FIG. 2. That is, power source (40) for compensation and switch (SW) timing circuit (42) correspond to power source (20) for compensating the circuit characteristics and timing circuit (22) shown in FIG. 2. Also, they are set close to each other on the same integrated circuit chip. First, current source I of said power source (40) for compensation is connected between power source voltage terminal VDD and supply voltage output terminal OUT, and PMOS transistor Tr1 and NMOS transistor Tr2 are connected in series between output terminal OUT and ground GND. Said power source voltage terminal VDD is connected so that it receives the power source voltage from power source (24) shown in FIG. 2. The gate and drain of said PMOS transistor Tr1 are connected to each other, that is, a diode connection is used so that threshold voltage Vth sensor is formed. Then, by connecting the gate of NMOS transistor Tr2 to a specific reference voltage Vref (such as 1.2 V), a temperature sensor is formed. Consequently, it is preferred that said MOS transistors Tr1 and Tr2 be set close to each other as compared with the corresponding transistors in SW timing circuit (42) as the detection object. For example, said reference voltage Vref can be generated by a band gap circuit. More specifically, due to the current flowing through diode-connected transistor Tr1 from current source I, gate-source voltage $V_{GS}$ significantly depends on threshold voltage Vth of the PMOS transistor. Also, this threshold voltage, and hence gate-source voltage $V_{GS}$, become larger as the manufacturing process becomes weaker. On the other hand, transistor Tr2 acts as a resistor operating in the linear region. Its resistance, and hence the values of drain-source resistance $R_{DS}$ and drain-source voltage $V_{DS}$, significantly depends on the temperature-dependence of the mobility. Consequently, as the temperature rises, $V_{DS}$ rises. The magnitude of supply voltage $V_{REGO}$ becomes the sum of said gate-source voltage $V_{GS}$ (or threshold voltage Vth) and drain-source voltage $V_{DS}$.

Said SW timing circuit (42) that receives said supply voltage $V_{REGO}$ has two groups of inverter chains (including a circuit chain containing the buffer and/or inverter). The upper group has four inverter buffers, that is, inverters connected in series, where the second inverter and the fourth inverter generate timing signals PH1 and PH2. On the other hand, the lower inverter chain has four buffers connected in series. The first buffer is a non-inverted buffer, the second-fourth buffers are inverted buffers, that is, inverters. Similarly, the second inverter and the fourth inverter generate timing signals PH1Z and PH2Z. As shown in FIG. 5, signals PH1Z and PH2Z are the inversion of signals PH1 and PH2, respectively. As shown in FIG. 4, the 8 buffers are connected such that they all can receive $V_{REGO}$ as the power source voltage. Also, the various buffers may have the circuit constitution shown in FIG. 3(b).

Figure 6A:
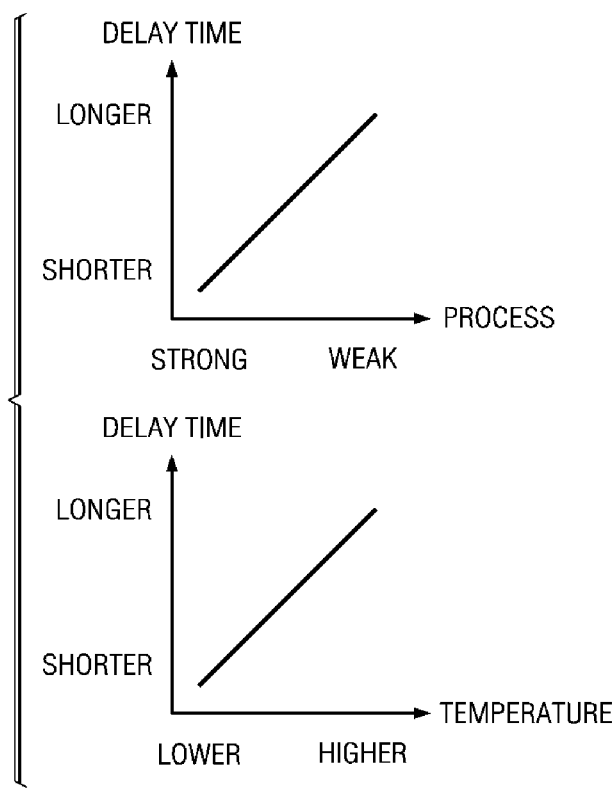
FIG. 6 is a graph illustrating the overall operation of the power source for compensation and the SW timing circuit shown in FIG. 4.
Figure 6B:
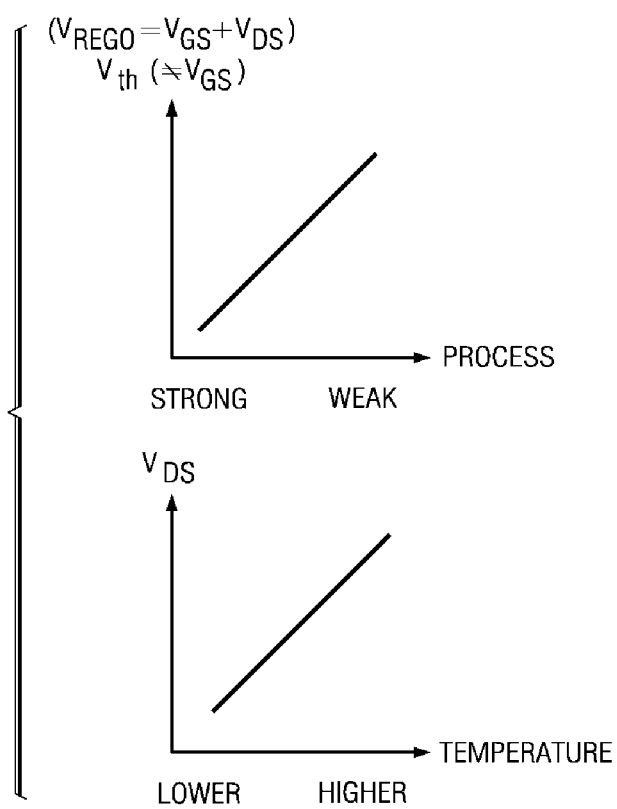
Figure 6C:
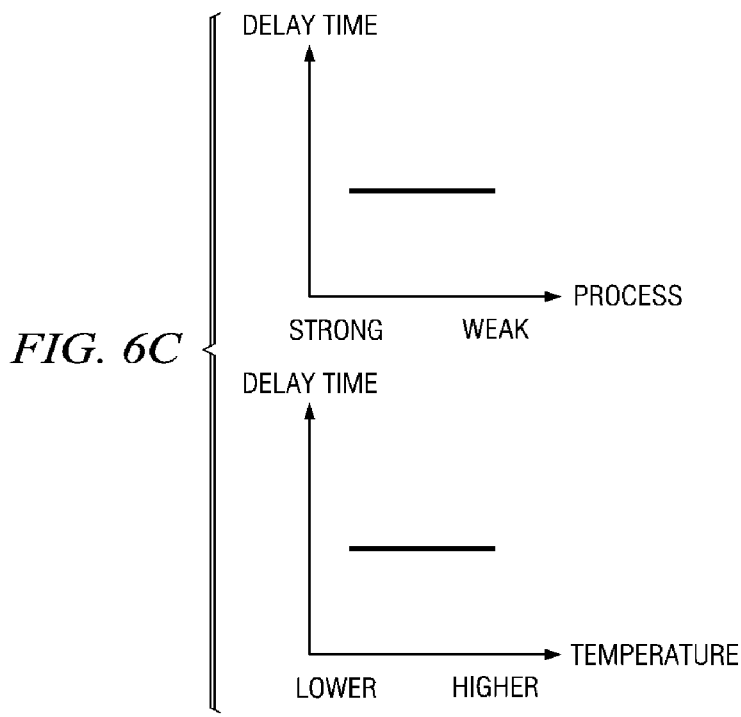

In the following, based on FIG. 6, an explanation will be given in detail regarding the overall operation of power source (40) for compensation and SW timing circuit (42) shown in FIG. 4. First, for the delay time in each buffer in SW timing circuit (42), when the power source voltage supplied to the buffer is constant, as shown in FIG. 6(a), as the manufacturing process becomes weaker, the threshold voltage of the transistor, and hence gate-source voltage $V_{GS}$, become larger. As a result, as can be seen from FIG. 6(c), the delay time of the inverter output becomes longer. As the manufacturing process becomes stronger, the opposite function is displayed. On the other hand, when the temperature rises, the threshold voltage falls. However, drain-source resistance $R_{DS}$ of the transistor increases. The increase in the resistance has a significant influence, and the drive current through the inverter is reduced. As a result, the delay time of the inverter output is increased. When the temperature falls, the opposite occurs.

For SW timing circuit (42) that operates as described above, by feeding supply voltage $V_{REGO}$ generated by power source (40) for compensation instead of the prescribed power source voltage, the aforementioned variations in the delay time can be reduced. That is, as shown in FIG. 6(b), as described above, when the process of SW timing circuit (42) becomes weaker, the process of power source (40) for compensation in an environment identical or similar to that of SW timing circuit (42) also becomes weaker. As a result, the threshold voltage of Tr1, and hence $V_{GS}$, increases, and supply voltage $V_{REGO}$ increases. As a result, even when an increase in the threshold voltage acts to increase the delay time of the inverter output, due to rise in supply voltage $V_{REGO}$, it acts in the direction to reduce the delay time. Consequently, as shown in FIG. 6(c), variations in the delay time can be cancelled or reduced. Similarly, as shown in FIG. 6(b), as the circuit temperature of SW timing circuit (42) rises, the circuit temperature of power source (40) for compensation also rises, so that drain-source voltage $V_{DS}$ rises. As a result, supply voltage $V_{REGO}$ increases. Consequently, even when a rise in temperature acts to increase the delay time of the inverter output, the rise in supply voltage $V_{REGO}$ still acts to increase the drive current and thus shorten the delay time. Consequently, as shown in FIG. 6(c), variations in the delay time can be cancelled or reduced. In this way, with the circuit constitution shown in FIG. 4, although there are process or temperature variations, as shown in FIG. 5, it is still possible to generate a timing signal or a phase difference signal with a nearly constant delay time.

Figure 7:
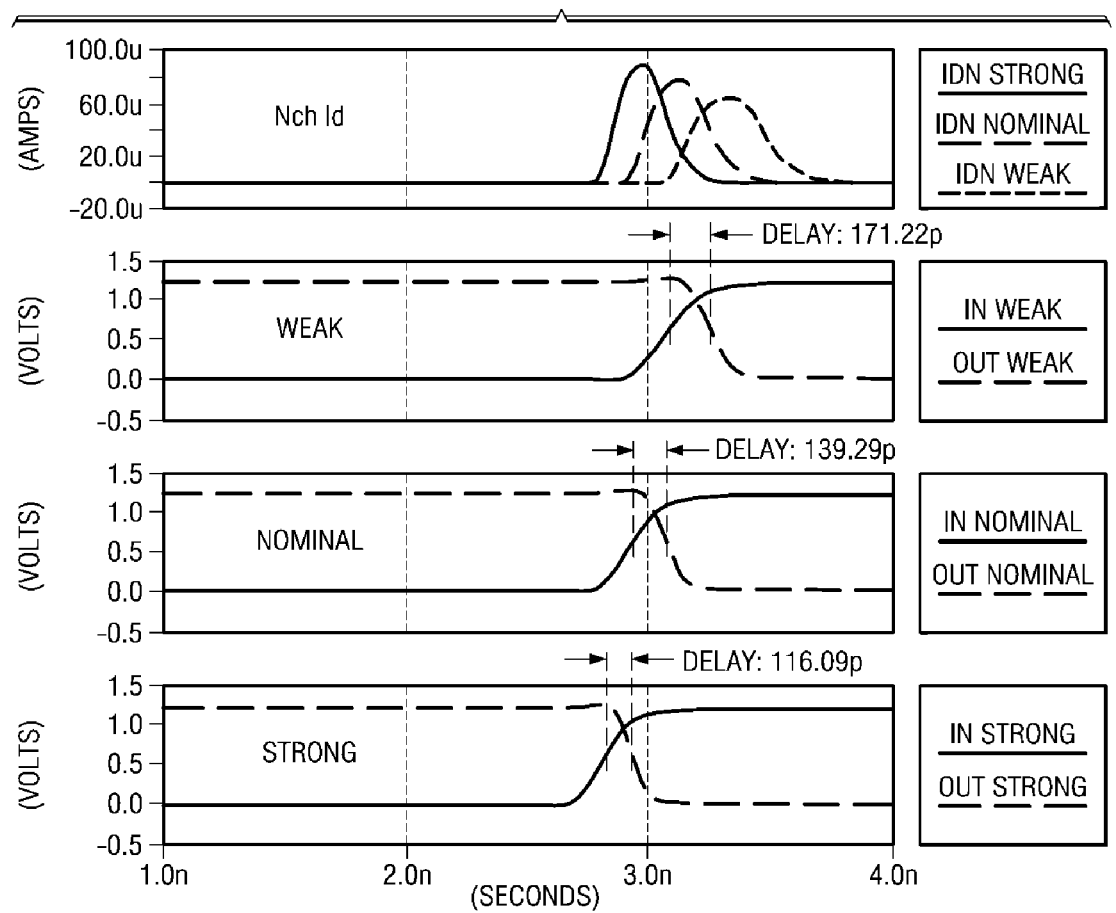
FIG. 7 is a timing diagram illustrating the waveforms of the drain current and the input/output with respect to process variations when the present invention is not adopted for an inverter in the inverter chain.
Figure 8:
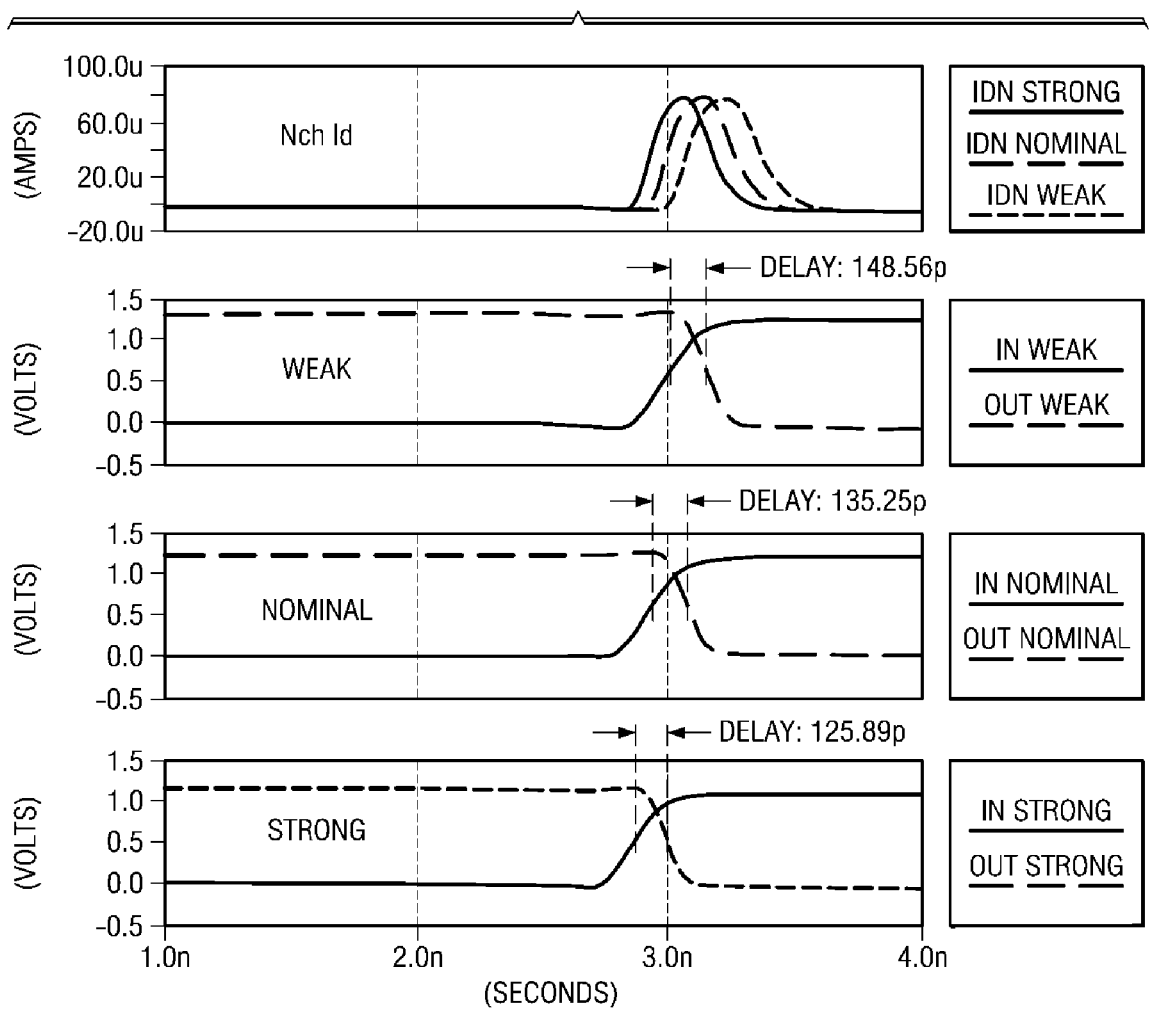
FIG. 8 is a timing diagram illustrating the waveforms of the drain current and input/output with respect to the process variations when the present invention is adopted for an inverter in the inverter chain.
Figure 9:
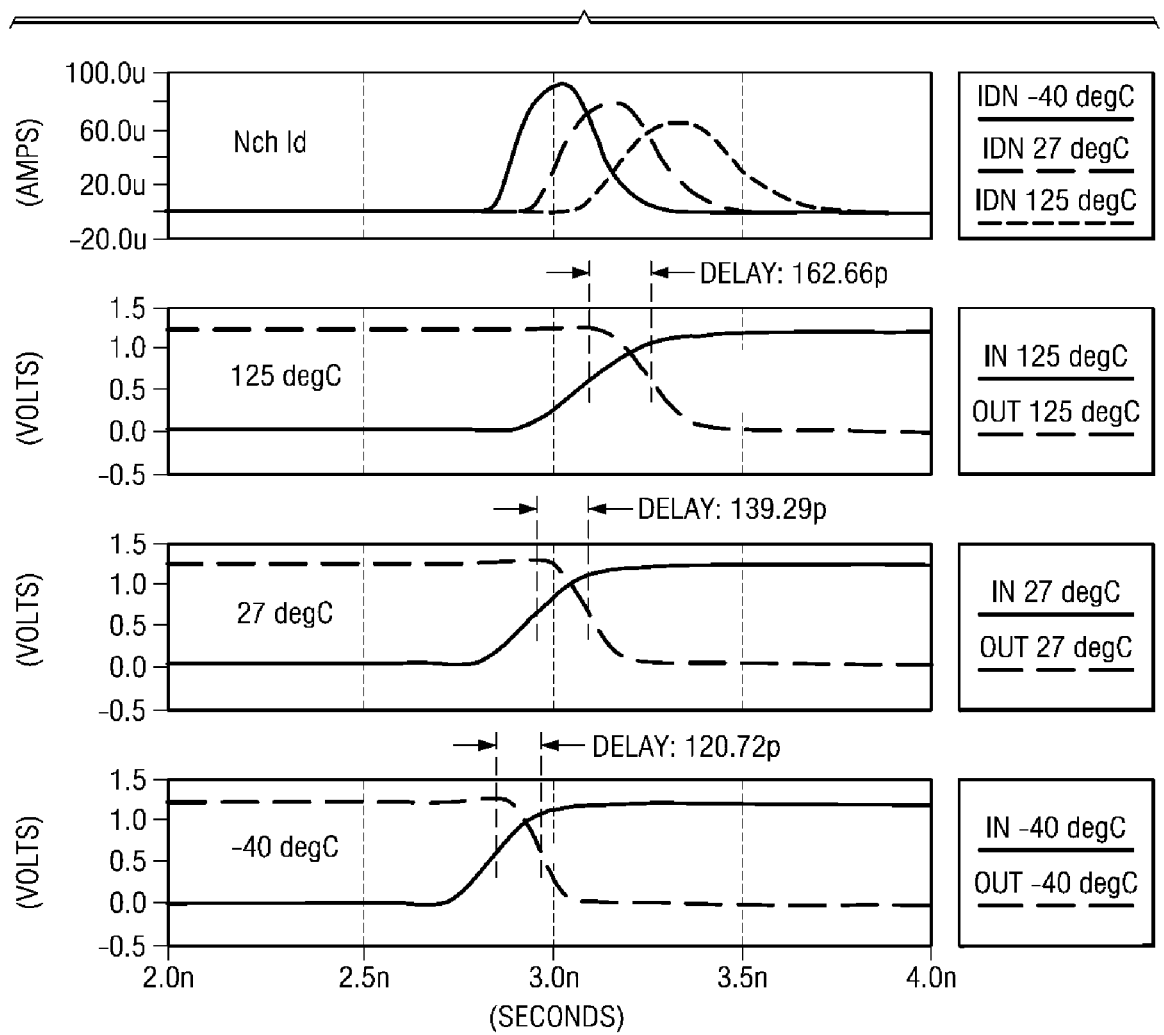
FIG. 9 is a timing diagram illustrating the waveforms of the drain current and input/output with respect to the variation in temperature when the present invention is not adopted for an inverter in the inverter chain.
Figure 10:
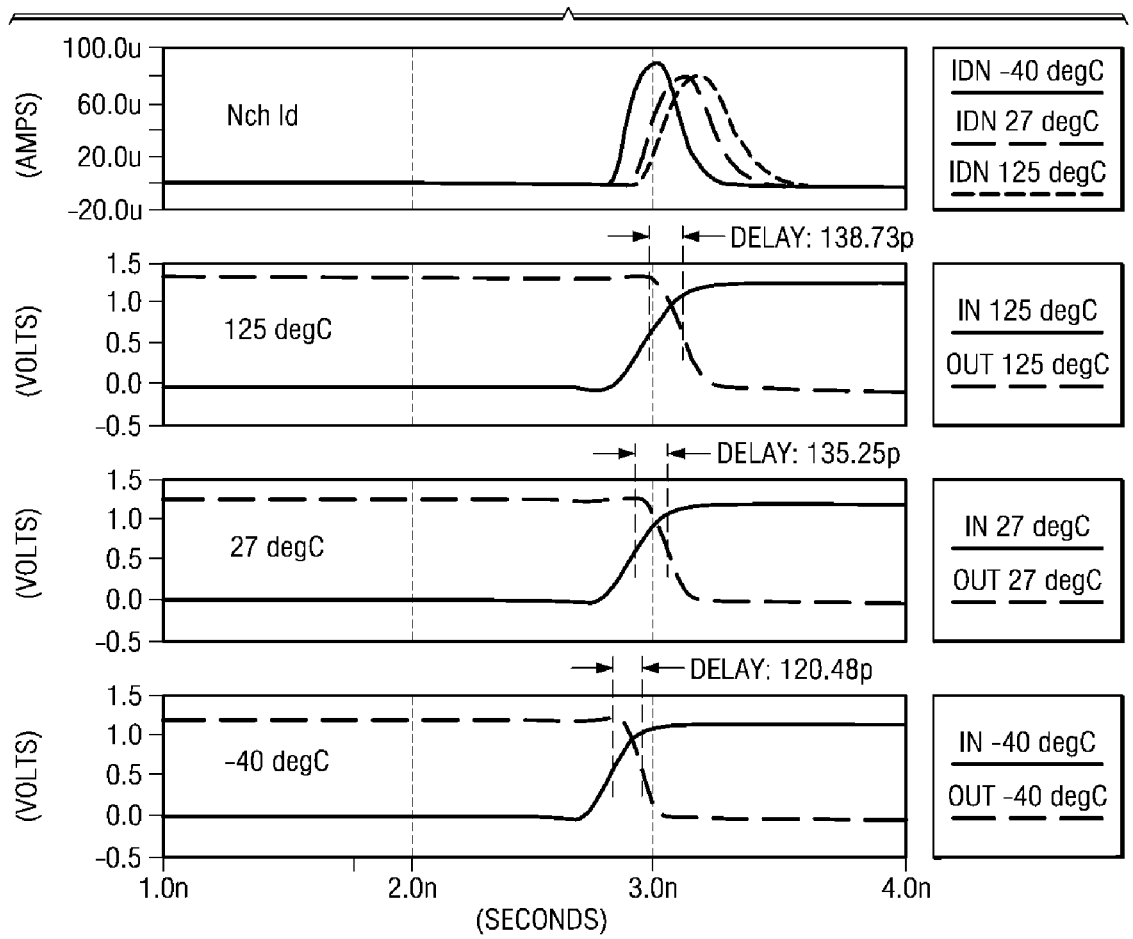
FIG. 10 is a timing diagram illustrating the waveforms of the drain current and input/output with respect to the variation in temperature when the present invention is adopted for an inverter in the inverter chain.

In the following, a detailed explanation will be given regarding the simulation results to illustrate the advantages of the present invention with reference to FIGS. 7-10. In this simulation, an inverter chain composed of 6 inverters connected in series is used. FIGS. 7-10 are timing diagrams illustrating the drain current of the $5^{th}$ inverter counted from the input side, and the waveforms of the input and output of the $5^{th}$ inverter under three different conditions. Also, FIGS. 7 and 8 show the simulation results for the case when the process varies (process dependence) when the temperature is fixed at 27° C. FIG. 7 shows the case when the present invention is not adopted (without supply voltage compensation). On the other hand, FIG. 8 shows the case when the present invention is adopted (with supply voltage compensation), that is, the case when the supply voltage adjustment by the present invention is adopted. In addition, FIGS. 9 and 10 show the simulation results for the case when the temperature varies (temperature dependence) while the process is constant (nominal (intermediate)). FIG. 9 shows the case when the present invention is not adopted. FIG. 10 shows the case when the present invention is adopted.

First, in the process variation when the present invention is not adopted as shown in FIG. 7, because the threshold voltage increases when the process is weak, the top drain current (Nch Id) (corresponding to the sink current flowing through the NMOS transistor in FIG. 3(b)) has a gentler slope and a lower peak than those when the process is nominal. Also, because said drain current is from the $5^{th}$ inverter, compared with the nominal case, the process is delayed overall. The delay time of the inverter in this weak case, that is, the time difference between the input voltage (In) of the inverter and the output voltage (Out), is 171.17 ps as shown in the waveform diagram of the second step counting from the top. This delay time is longer by about 32 ps than the delay time of 139.24 ps for the bottom nominal case. On the other hand, because the process has a lower threshold voltage than that for the strong case, the drain current of the top step has a steeper slope and a higher peak value than when the process is nominal. Also, it leads in time for the whole. The delay time of the inverter in said strong case is 116.39 ps as shown in the waveform diagram of the third step counting from the top. This delay time is shorter by 23 ps than the delay time in the bottom nominal (intermediate) step. In addition, the delay time in the process variation is about 116-171 ps, and the variation width is about 65 ps.

On the other hand, for the process variation in the case when the present invention is adopted as shown in FIG. 8, when the process is weak, the drain current of the top step has nearly the same slope and peak value as those for the nominal process. Also, when compared with the nominal process, the delay of the drain current becomes less than half that shown in FIG. 7. The delay time in the weak state is 150.9 ps, as shown in the waveform diagram of the second step counting from the top. The delay time is longer than the delay time of 136.48 ps in the case of the bottom nominal case by 15 ps. This is less than half the time 32 ps, for the case shown in FIG. 7. Also, even when the process becomes strong, the drain current of the top step has nearly the same slope and peak value as those of the nominal process. In addition, the lead time of the overall drain current is less than half that shown in FIG. 7. The delay time of the inverter in the strong case is 125.4 ps, as shown in the waveform diagram of the third step counting from the top. This delay time is shorter by about 11 ps than the delay time in the bottom nominal (intermediate) case, yet is reduced to half or shorter than the 23 ps in the case shown in FIG. 7. In addition, the delay time in the process variation is about 125-151 ps, and the variation is about 25 ps. This is less than half the 65 ps for the case shown in FIG. 7.

Similarly, as shown in FIGS. 9 and 10, whether or not the present invention is adopted, if the temperature varies (−40° C.~125° C.) the delay time is reduced as described above. That is, as can be seen from FIG. 9, the delay time with respect to the variation in temperature is changed from 120.72 ps to 162.47 ps, and the variation is about 41 ps. On the other hand, as shown in FIG. 10, the delay time varies from 120.07 ps to 140.39 ps, and the variation is 20 ps. This is less than half that for the case shown in FIG. 9. As can be seen from FIGS. 7-10, when the present invention is adopted, the variation in the delay time of the inverter can be significantly reduced.

Figure 11:
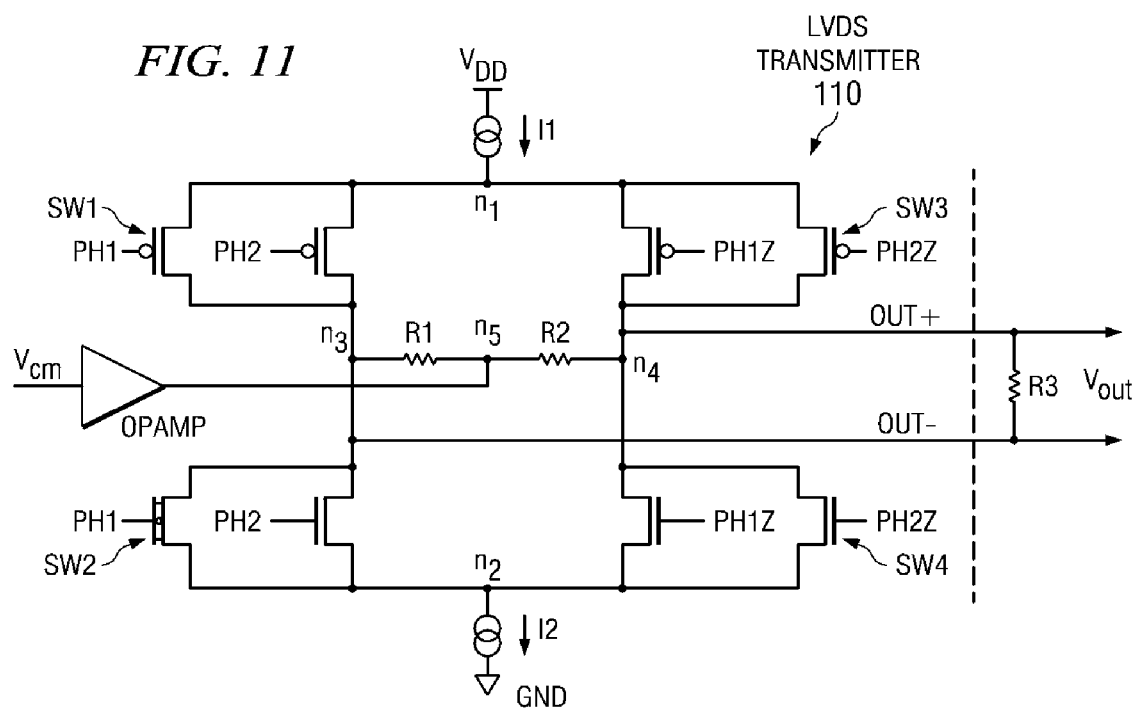
FIG. 11 is a circuit diagram illustrating the LVDS transmitter as an example of the buffer shown in FIG. 2.

In the following, with reference to FIG. 11, an explanation will be given regarding LVDS transmitter (110) as an example of buffer (26) shown in FIG. 2. This LVDS transmitter (110) receives timing signals PH1, PH2, PH1Z and PH2Z from SW timing circuit (42) shown in FIG. 4 as an example of timing circuit (22) shown in FIG. 2. Also, for the LVDS transmitter shown in FIG. 11, these timing signals have the timing relationship shown in the timing diagram in FIG. 12 instead of FIG. 5, and SW timing circuit (42) is designed so that the timing relationship is realized.

More specifically, as shown in the figure, said LVDS transmitter comprises current sources I1 and I2, four switches SW1-4, resistors R1, R2, and an op amp. Also, resistor R3 is the terminal resistor. Current source I1 is connected between power source voltage terminal VDD and node n1, and current source I2 is connected between node n2 and ground terminal GND. Switches SW1 and SW2 are connected in series between nodes n1 and n2, and switches SW3 and SW4 are connected in series between nodes n1 and n2. Resistors R1 and R2 are connected in series between node n3 between SW1 and SW2 and node n4 between SW3 and SW4. The op amp output is connected to node n5 between resistors R1 and R2, and the op amp input is connected to receive common mode control voltage Vcm. The positive-side output terminal OUT+ of the transmitter is connected to node n4, and the negative-side output terminal OUT− is connected to node n3. As shown in FIG. 11, terminal resistor R3 is connected between said output terminals. Also, switches SW1 and SW2 receive timing signals PH1 and PH2, and switches SW3 and SW4 are connected to receive timing signals PH1Z and PH2Z. In said LVDS transmitter, the swing range of the output voltage depends on the values of resistors R1, R2, R3 so that said swing range is 150 mV. For example, when VDD is 1.5 V and I1, I2 are 3 mA, R1 and R2 are 50Ω, and R3 is 100Ω.

Figure 12:
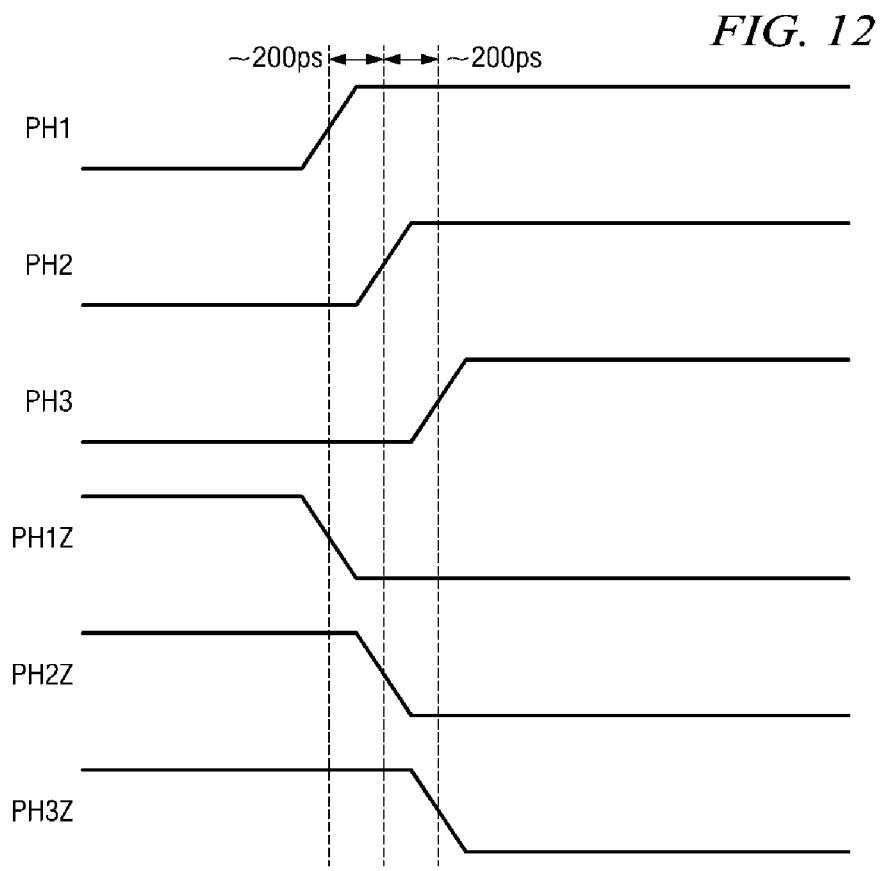
FIG. 12 is a timing diagram illustrating the waveform of the timing signal supplied by the SW timing circuit shown in FIG. 4 to switches SW1-4 shown in FIG. 11.

SW1 and SW4 of the transmitter with said constitution turn on or off simultaneously, or SW3 and SW2 turn on or off simultaneously. For example, as shown in FIG. 12, if PH1 and PH2 rise, SW3 and SW2 turn on, so that the current flows from VDD through current source I1, SW3, resistor R3, SW2, current source I2, and from VDD through current source I1, SW3, resistors R2, R1, SW2, and current source I2. As a result, output terminal OUT+ become the high level, and output terminal OUT− goes low. On the other hand, if PH1 and PH2 fall, as current flows through SW1 and SW4, output terminal OUT+ goes low, and output terminal OUT− goes high.

Also, each of switches SW1-SW4 may be composed of a single MOS transistor. However, in this example, two MOS transistor switches are connected in parallel to form each switch. In this constitution, control is performed so that one of the two MOS transistor switches is turned on (or turned off), and, after the turn on (or turn-off) process of said one switch is finished, the other switch starts its turn-on (or turn-off) process. In order to realize this control, for SW timing circuit (42), as shown in the timing chart in FIG. 12, the delay time between timing signals PH1 and PH2, and the delay time between PH1Z and PH2Z are correctly controlled. For example, the delay time between PH1 and PH2 is about 200 ps as shown in FIG. 12.

In the following, an explanation will be given regarding the operation of the individual SW in this case. For example, as far as SW2 is concerned, as PH1 rises, one NMOS transistor that receives said PH1 at its gate starts to turn on, and when said turn on process is completed, the other NMOS transistor that receives PH2 at its gate starts to turn on. In this way, two NMOS transistors, can be used as a single switch that can handle a higher current load. With this constitution and control, compared with the case when a single MOS transistor switch is used, it is possible to reduce the problem of transient phenomena.

Also, each of said switches SW1-SW4 can be composed of three or more MOS transistors connected in parallel. FIG. 12 is a diagram illustrating the third timing signal PH3 and PH3Z for the case where each switch SW is composed of three MOS transistors. This addition of the timing signal can be realized simply by adding the number of buffers or inverters in the inverter chain of SW timing circuit (42) shown in FIG. 4.

Figure 5:
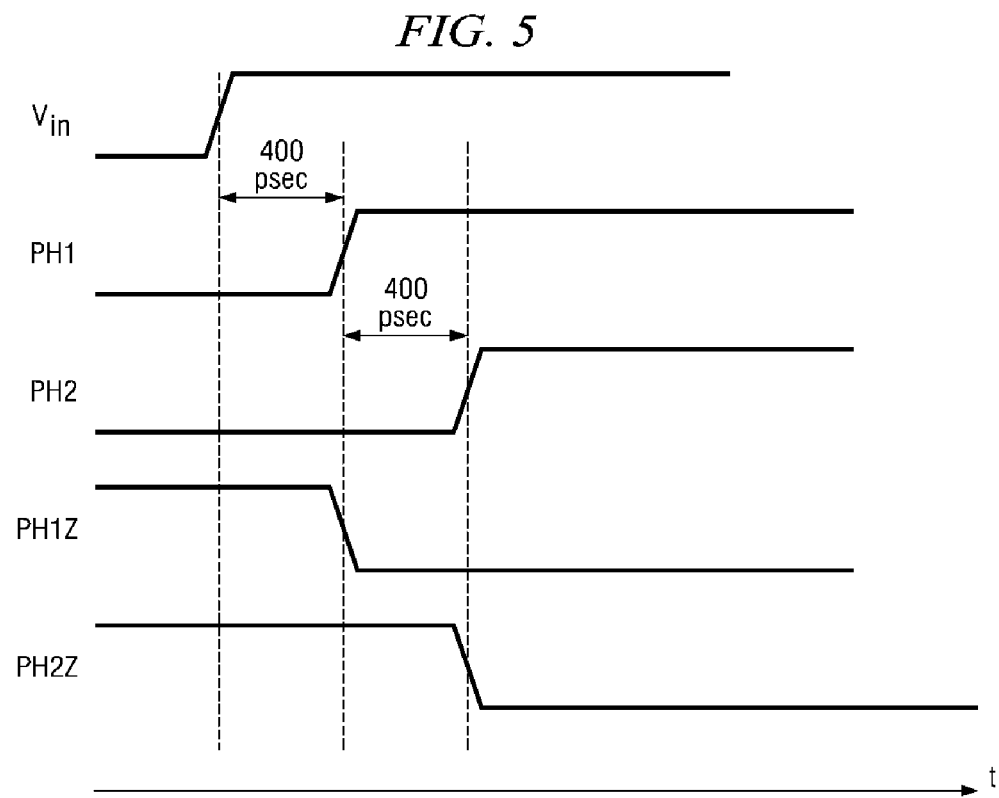
FIG. 5 is a timing diagram illustrating the waveforms of the four timing signals generated by the SW timing circuit shown in FIG. 4.

As explained above, by using the timing signal generated by combining power source (40) for compensation and SW timing circuit (42) in FIG. 4 as the timing signal for driving LVDS transmitter (110), it is possible to reduce the variation in the output waveform of the transmitter, such as the variation in the rise time and fall time.

In the following, an explanation will be given regarding another embodiment of power source (40) for compensation shown in FIG. 4 with reference to FIGS. 13-15.

Figure 13:
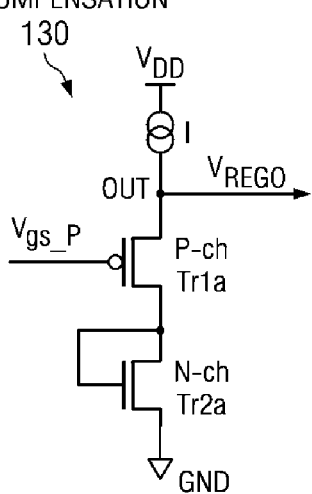
FIG. 13 is a circuit diagram illustrating another embodiment of the power source for compensation shown in FIG. 4.

First, power source (130) for compensation shown in FIG. 13 is similar to that shown in FIG. 4, except that NMOS transistor Tr2a is diode-connected to form a threshold sensor, and, on the other hand, the gate of PMOS transistor Tr1a on the side of output terminal OUT is connected to reference voltage Vgs-P to form a temperature sensor.

Figure 14:
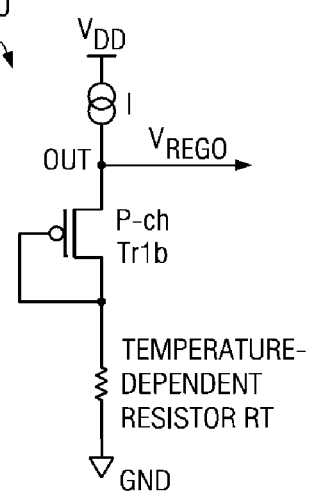
FIG. 14 is a circuit diagram illustrating another embodiment of the power source for compensation shown in FIG. 4.
Figure 15:
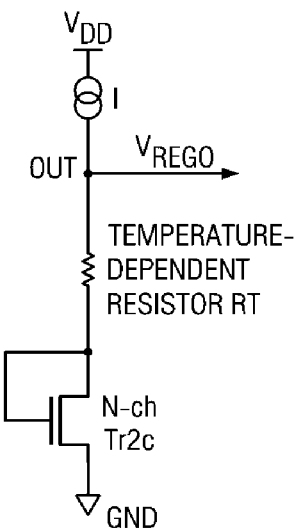
FIG. 15 is a circuit diagram illustrating another embodiment of the power source for compensation shown in FIG. 4.

Also, power source (140) for compensation shown in FIG. 14 is similar to that shown in FIG. 4, except that instead of NMOS transistor, resistor $R_T$ with temperature-dependent resistance is used. It is preferred that this resistor have the same characteristics as those of the resistor component depending on the temperature of the MOS transistor. However, there is no problem if the temperature-dependence characteristics are different. The structure shown in FIG. 15 utilizes temperature-dependent resistor $R_T$ like shown in FIG. 14, and NMOS transistor Tr1c is diode-connected like that shown in FIG. 13. It is possible to generate supply voltage $V_{REGO}$ for compensating the circuit characteristics by means of the power source with the circuit constitution shown in FIGS. 13-15.

Figure 17:
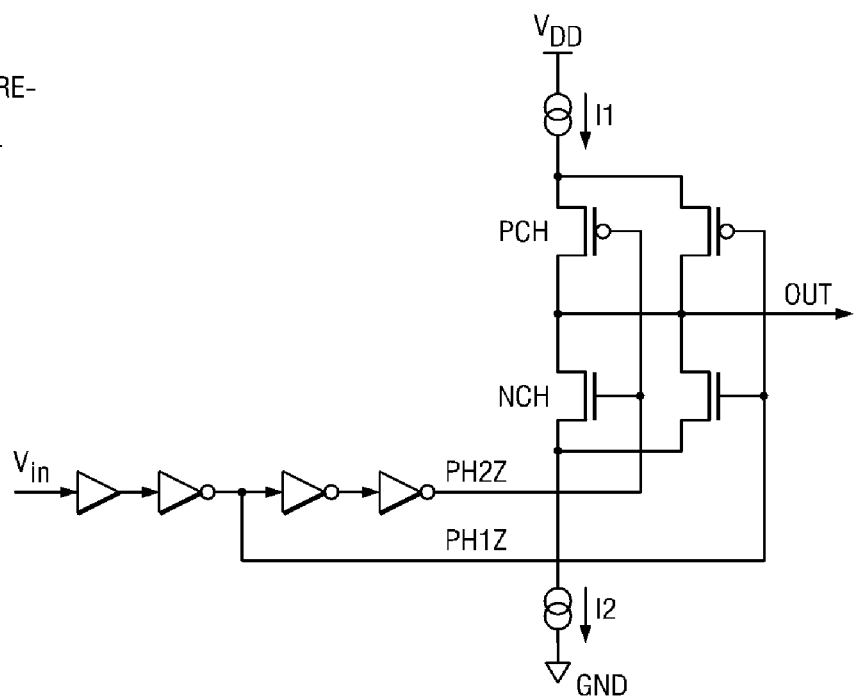
FIG. 17 is a circuit diagram illustrating the current output buffer of the single output type as another example of the buffer shown in FIG. 2.
Figure 16:
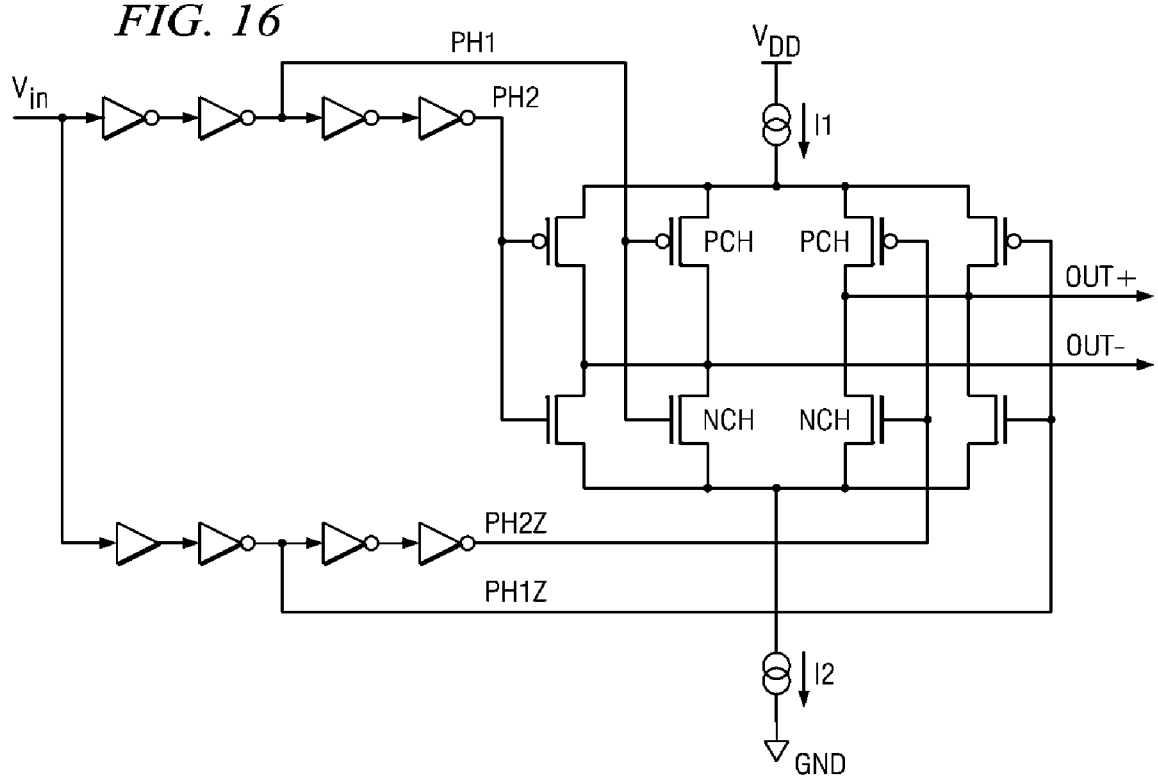
FIG. 16 is a circuit diagram illustrating the current output buffer of the differential output type as another example of the buffer shown in FIG. 2.

In the following, an explanation will be given regarding another example of buffer (26) shown in FIG. 2, unlike that shown in FIG. 11, with reference to FIGS. 16-19. In FIGS. 16-19, the same part numbers as those shown in FIGS. 4 and 11 are used. Also, FIGS. 16-19 show the circuit elements corresponding to those in the SW timing circuit shown in FIG. 4. More specifically, FIG. 16 shows current output buffer (160) of the differential output type. This current output buffer (160) is unlike that shown in FIGS. 4 and 11 in that only resistors R1, R2 and R3 required for LVDS, as well as the op amp, are deleted. Single-output type current output buffer (170) shown in FIG. 17 is similar to that shown in FIG. 16, except that in order to have a single output, that is, a single-ended output, one group of the inverter chain is deleted, and the left side group of switches are deleted. Also, one may delete the inverter chain and switch group on the opposite side.

Figure 18:
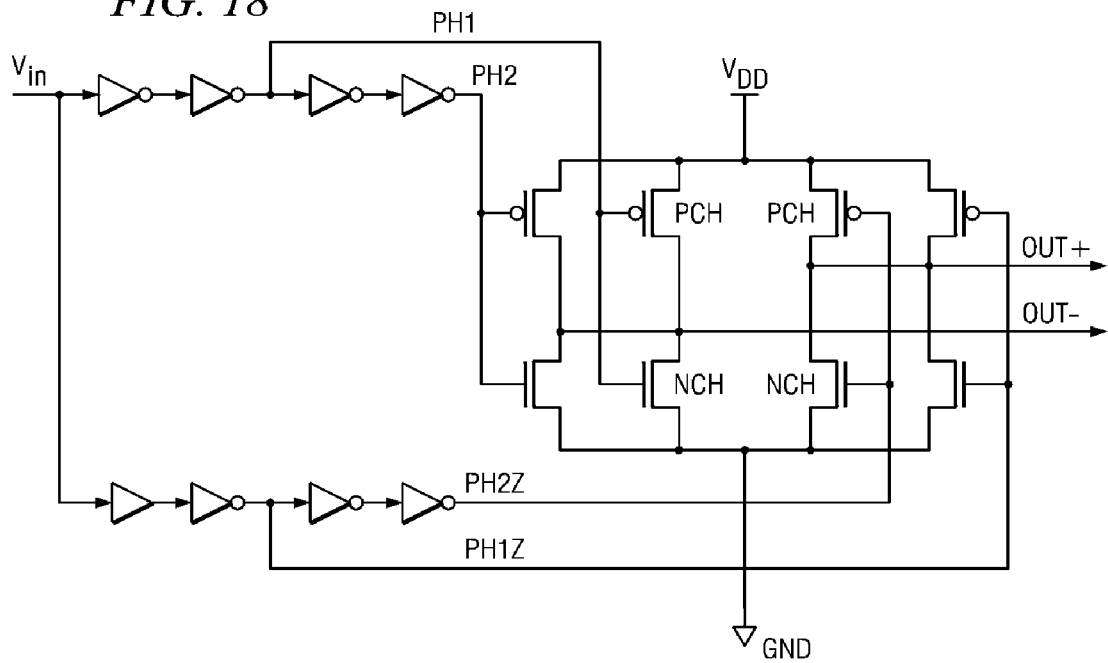
FIG. 18 is a circuit diagram illustrating the voltage output buffer of the differential output type as another example of the buffer shown in FIG. 2.
Figure 19:
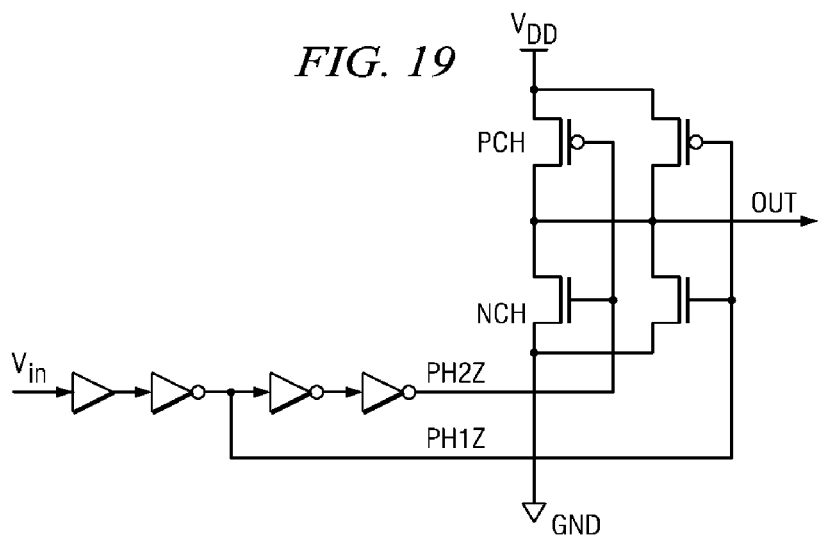
FIG. 19 is a circuit diagram illustrating the voltage output buffer of the single output type as another example of the buffer shown in FIG. 2.

FIG. 18 is a diagram illustrating voltage output buffer (180) of the differential output type. This voltage output buffer (180) differs from current output buffer (160) shown in FIG. 16 in that it does not contain current sources I1 and I2. Also, the single-output type voltage output buffer (190) shown in FIG. 19 is similar to voltage output buffer (180) shown in FIG. 18, except that in order to have a single output, that is, a single-ended output, one group of the inverter chain is deleted, and the left side group of switches are deleted. Also, one may delete the inverter chain and switch group on the opposite side.

As explained above, for the buffers with the constitution shown in FIGS. 16-19, it is possible to supply the timing signal generated by SW timing circuit (42) for controlling the operation. As a result, it is possible to reduce the variation in the output waveform of the output buffer, such as the variation in the rise time and fall time.

Figure 20:
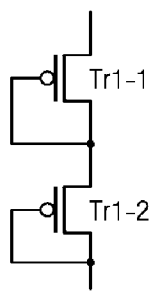
FIG. 20 is a circuit diagram illustrating another embodiment of the threshold sensor shown in FIG. 4.
Figure 21:
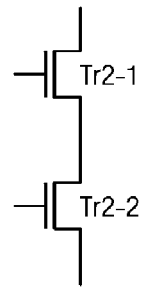
FIG. 21 is a circuit diagram illustrating another embodiment of the temperature sensor shown in FIG. 4.

Finally, for power source (40) for compensation shown in FIG. 4, the explanation used an example in which one MOS transistor is used as the threshold sensor or temperature sensor. However, the scheme shown in FIGS. 20 and 21 can be used, where two MOS transistors Tr-1 and Tr-2, or Tr2-1 and Tr2-2, or more MOS transistors are adopted. The same is true for the power source for compensation shown in FIGS. 13-15, so that it is possible to increase the number of elements that form each sensor.

While the invention has been particularly shown and described with reference in preferred embodiments thereof it is well understood by those skilled in the art that various changes and modifications can be made in the invention without departing from the spirit and scope of the invention as defined by the appended claims.

The invention claimed is:

1. A signal output circuit comprising:
   a signal generator that generates plural control signals having a prescribed phase difference;
   a voltage generator that comprises circuit elements with the same variations selected from the group consisting of characteristics with respect to the manufacturing process, temperature, as those of the circuit elements of said signal generator, and supplies the power source voltage to said signal generator; and
   an output circuit that is connected to a first and second signal output terminal and that comprises plural output transistors, to respective control terminals of which said control signals having a prescribed phase difference are applied, wherein said output circuit comprises a first transistor group connected to the first signal output terminal and a second transistor group connected to the second signal output terminal;
   a differential signal is output from said first and second signal output terminals, and wherein said first transistor group contains plural transistor pairs, each of which is composed of a transistor of the first conductivity type and a transistor of the second conductivity type, and said control signals having a prescribed phase difference are supplied to said plural transistor pairs, respectively;
   said second transistor group contains plural transistor pairs, each of which is composed of a transistor of the first conductivity type and a transistor of the second conductivity type, and said control signals having a prescribed phase difference are supplied to said plural transistor pairs, respectively; and the phases of said control signals supplied to the transistor pairs of said first transistor group are inverted with respect to the phases of said control signals supplied to the transistor pairs of said second transistor group.

2. The signal output circuit described in claim 1 wherein said signal generator comprises plural inverter circuits containing transistors as circuit elements; and said voltage generator has transistors as circuit elements.

3. The signal output circuit described in claim 1 wherein said voltage generator comprises a constant current circuit that supplies a prescribed constant current and a first transistor connected in the current path of said constant current circuit, said first transistor is connected as a diode.

4. The signal output circuit described in claim 3 wherein said voltage generator comprises a second transistor connected in the current path of said constant current circuit; and a reference voltage is supplied to the control terminal of said second transistor.

5. The signal output circuit described in claim 4 wherein said first transistor is a PMOS transistor, and that said second transistor is an NMOS transistor.

* * * * *